(12) United States Patent
Burns et al.

(10) Patent No.: US 11,885,830 B2
(45) Date of Patent: Jan. 30, 2024

(54) PROBE TIP ASSEMBLY FOR TESTING OPTICAL COMPONENTS

(71) Applicant: Lumentum Operations LLC, San Jose, CA (US)

(72) Inventors: Sean Burns, Menlo Park, CA (US); Raman Srinivasan, San Jose, CA (US); Lucas Morales, San Francisco, CA (US); Tian Shi, Fremont, CA (US); Yuanzhen Zhuang, San Jose, CA (US); Cho-Shuen Hsieh, Zhubei (TW); Albert Huang, Taoyuan (TW)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 17/360,260

(22) Filed: Jun. 28, 2021

(65) Prior Publication Data
US 2022/0229091 A1    Jul. 21, 2022

Related U.S. Application Data

(60) Provisional application No. 63/138,215, filed on Jan. 15, 2021.

(51) Int. Cl.
*G01R 1/073* (2006.01)
*G01R 1/067* (2006.01)

(52) U.S. Cl.
CPC ..... *G01R 1/07342* (2013.01); *G01R 1/06761* (2013.01)

(58) Field of Classification Search
CPC ............ G01R 1/07342; G01R 1/06761; G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06766; G01R 1/06772; G01R 1/06777; G01R 1/073; G01R 1/07307; G01R 1/07314; G01R 1/07321; G01R 1/07328; G01R 1/07335; G01R 1/0735; G01R 1/07357; G01R 1/07364; G01R 1/07371; G01R 1/07378; G01R 1/07385; G01R 1/07392

See application file for complete search history.

(56) References Cited

U.S. PATENT DOCUMENTS

| 4,480,223 | A | * | 10/1984 | Aigo | ................. G01R 1/07342 324/755.02 |
| 5,416,429 | A | * | 5/1995 | McQuade | .......... G01R 1/07342 324/755.07 |
| 5,583,445 | A | | 12/1996 | Mullen | |
| 5,886,922 | A | | 3/1999 | Saito et al. | |

(Continued)

*Primary Examiner* — Lee E Rodak
(74) *Attorney, Agent, or Firm* — Harrity & Harrity, LLP

(57) ABSTRACT

In some implementations, a probe tip assembly includes a driver printed circuit board assembly (PCBA) and a probe tip subassembly. The probe tip subassembly includes a plurality of probe tips, wherein a probe tip, of the plurality of probe tips, extends beyond an end of the PCBA, and the PCBA and the probe tip are configured to transmit an electric signal to test an optical component. The probe tip may include a material comprising at least one of copper (Cu), a beryllium copper (BeCu) alloy, tungsten (W), Paliney, Neyoro, and/or another conductive material.

20 Claims, 9 Drawing Sheets

(56) References Cited

U.S. PATENT DOCUMENTS

| | | | |
|---|---|---|---|
| 5,974,662 A | 11/1999 | Eldridge et al. | |
| 6,515,358 B1* | 2/2003 | Dass | H01L 24/03 |
| | | | 257/679 |
| 6,692,145 B2 | 2/2004 | Gianchandani et al. | |
| 7,538,565 B1 | 5/2009 | Beaman et al. | |
| 2002/0011853 A1* | 1/2002 | Noda | G01R 1/06738 |
| | | | 324/755.11 |
| 2002/0175695 A1 | 11/2002 | Ahmann et al. | |
| 2004/0207419 A1 | 10/2004 | Ido | |
| 2012/0274347 A1* | 11/2012 | Wang | G01R 1/067 |
| | | | 324/755.02 |
| 2013/0113512 A1* | 5/2013 | Ogasawara | G01R 1/06772 |
| | | | 324/755.11 |
| 2021/0199691 A1* | 7/2021 | Piels | G01R 31/318511 |
| 2022/0178969 A1* | 6/2022 | Lou | G01R 1/06733 |

* cited by examiner

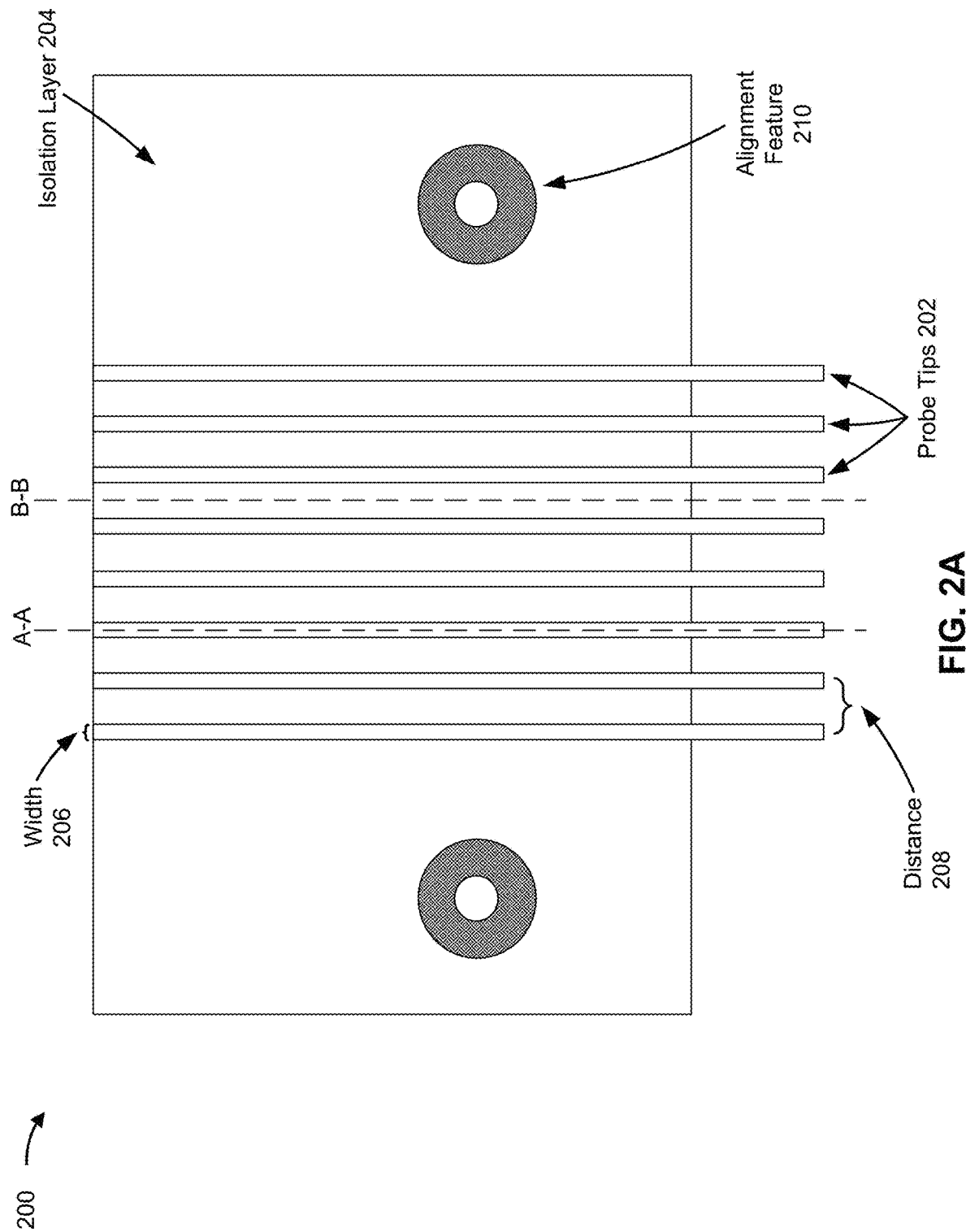

PROBE TIP ASSEMBLY FOR TESTING OPTICAL COMPONENTS

RELATED APPLICATION

This application claims priority to U.S. Provisional Patent Application No. 63/138,215, entitled "MICROCANTILEVER FOR HIGH-PEAK-CURRENT NANOSECOND-PULSE WAFER PROBING," filed on Jan. 15, 2021, the content of which is incorporated by reference herein in its entirety.

TECHNICAL FIELD

The present disclosure relates generally to a probe tip assembly for testing optical components and to a probe tip assembly to facilitate testing of optical components using high-current pulses in a nanosecond range.

BACKGROUND

A device prober tests optical or opto-electronic integrated circuits included in a die. The device prober may use a probe card that includes one or more probes that electrically contact the optical or opto-electronic integrated circuits to test the optical or opto-electronic integrated circuits (e.g., based on electrical and optical responses).

SUMMARY

In some implementations, a probe tip assembly includes a driver printed circuit board assembly (PCBA); and a probe tip subassembly comprising: a plurality of probe tips, wherein: a probe tip, of the plurality of probe tips, extends beyond an end of the PCBA, and the PCBA and the probe tip are configured to transmit an electric signal to test an optical component.

In some implementations, a probe tip subassembly includes an isolation layer; and a plurality of probe tips disposed on respective portions of a surface of the isolation layer wherein: a probe tip, of the plurality of probe tips, extends beyond an end of the isolation layer, and the probe tip is configured to transmit an electric signal to test an optical component.

In some implementations, a probe tip subassembly includes an isolation layer; and a signal layer disposed on a surface of the dielectric layer wherein: at least a portion of the signal layer extends beyond an edge of the isolation layer, and the portion of the signal layer that extends beyond an end of the dielectric layer is configured to transmit an electric signal to test an optical component.

BRIEF DESCRIPTION OF THE DRAWINGS

FIGS. 2A-2C are various views of an example implementation of a probe tip subassembly described herein.

DETAILED DESCRIPTION

Figure 1A:
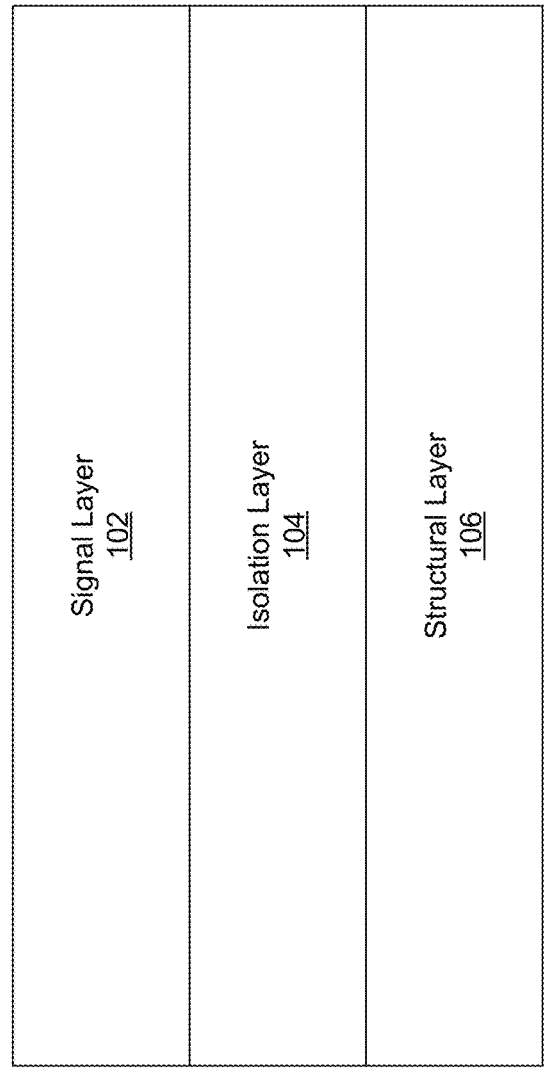
FIGS. 1A-1C are side, cross-sectional views of example implementations of layers of a probe tip subassembly described herein.

The following detailed description of example implementations refers to the accompanying drawings. The same reference numbers in different drawings may identify the same or similar elements.

A device prober tests components, such as optical or opto-electronic integrated circuits, included in a die of a wafer. The device prober may use a probe card that includes one or more probes that electrically contact the integrated circuits to test the integrated circuits (e.g., based on electrical and optical responses). For example, to test an integrated circuit of a die of the wafer, a driver circuit IC of the probe card may generate an electric signal (e.g., an electric pulse) that transmits through a probe of the probe card to the integrated circuit of the die. A response electric signal may propagate from the integrated circuit back to the probe card (e.g., where the electrical pulse and/or any electrical or optical signal generated by the electric signal acting on the integrated circuit is analyzed to determine whether the integrated circuit is functioning correctly). Alternatively, separate optical devices (e. g. optical power meters, optical spectrum analyzers, near and far field analyzers, oscilloscopes, and/or the like) may analyze optical output of an optical integrated circuit that is generated in response to the electrical signal to determine whether the optical integrated circuit is functioning correctly.

To effectively test the integrated circuit of the die, the driver circuit of the probe card may need to generate an electric signal with a high power level (e.g., a pulse with a high current level). In many cases, due to the high power level, the electrical signal needs to have a short duration, to avoid overheating and/or damaging the integrated circuit. Further, performance of the integrated circuit is often temperature dependent, so longer duration electric signals that heat the integrated circuit can impact the performance and analysis of the integrated circuit. In addition, to effectively test the integrated circuit of the die, the driver circuit of the probe card may need to generate a high-speed electric signal (e.g., a pulse with a fast rise time, a fast fall time, and/or of short duration). Typically, however, the driver circuit of the probe card is far away from the integrated circuit, which causes a path of transmission of the electrical signal (e.g., from the probe card, to the integrated circuit, and back to the probe card) to have a high amount of inductance. This may impede a rise and/or fall of current that is needed by the driver circuit of the probe card to generate the electric signal, which extends a duration (e.g., a pulse width) of the electric signal. Additionally, this may limit a maximum amount of current of the electrical signal, which may impact an ability of the probe card to effectively test the integrated circuit. Due to these limitations, conventional probe cards are only able to generate low-power electrical pulses with a long duration (e.g., in the microsecond range).

Some implementations described herein provide a probe tip subassembly that includes a plurality of probe tips disposed on respective portions of a surface of an isolation layer. The probe tips may be attached to the surface of the isolation layer and may extend beyond an end of the isolation layer (e.g., the probe tips may be cantilevered probe tips). The probe tips may comprise copper (Cu), a beryllium copper (BeCu) alloy, tungsten (W), Paliney, Neyoro, and/or another conductive material. Each probe tip may be formed in a signal layer and may be configured to transmit an electrical signal to test a component of a die of a wafer. The isolation layer may comprise a dielectric material, such as polyimide, and may be configured to electrically and/or physically insulate the probe tip. A structural and/or shielding layer (referred to herein as a structural/shielding layer) may be disposed on another surface of the isolation layer. The structural/shielding layer may comprise Cu, a BeCu alloy, W, Paliney, Neyoro, and/or another conductive material and may be configured to provide electrical shielding and/or electrical grounding for the probe tip. The structural/shielding layer may be configured to provide mechanical strength and/or a spring force for the probe tip subassembly.

In some implementations, a probe tip subassembly may include a probe tip (e.g., that comprises a signal layer), an isolation layer (e.g., that comprises a dielectric layer), and/or a structural/shielding layer. The probe tip subassembly may be disposed on a surface of a driver printed circuit board assembly (PCBA) of a probe tip assembly and at least one high speed switch 304 (e.g., that includes at least one of an integrated circuit (IC), a capacitor, a resistor, or a field-effect transistor (FET), among other examples) may be disposed on another surface of the PCBA. The probe tip subassembly may be electrically connected to the driver IC by a connective trace that may be at least partially disposed within a via of the driver PCBA. Alternatively, the probe tip subassembly may be an integral part of the driver PCBA (e.g. the isolation layer may serve as a dielectric layer for both the probe tip subassembly and the driver PCBA). In this configuration, the probe tip subassembly is an extension in a vertical direction (e.g., a thickness of the driver PCBA).

In this way, some implementations provide a shorter transmission path (e.g., an electrical transmission path) from the at least one high speed switch to a probe tip than is possible using a conventional probe card. This minimizes inductance associated with electric signal testing of an optical component. Accordingly, the at least one high speed switch is able to generate high-power electric signals with a duration in the sub-microsecond range (e.g., in the nanosecond range).

Moreover, some implementations described herein eliminate a need for probe head components to hold probe tips to a probe tip assembly or probe tip subassembly, which reduces a complexity and/or cost associated with manufacturing and/or maintaining a probe tip assembly and/or a probe tip subassembly. Further, in some implementations, the probe tips comprise BeCu, which causes the probe tips to have high strength and high fatigue strength under flexure and therefore be less prone to breakage and/or more likely to have a longer operable life than conventional probe tips of comparable size (e.g., micro-electromechanical system (MEMS) probe tips).

Figure 1B:
Figure 1C:
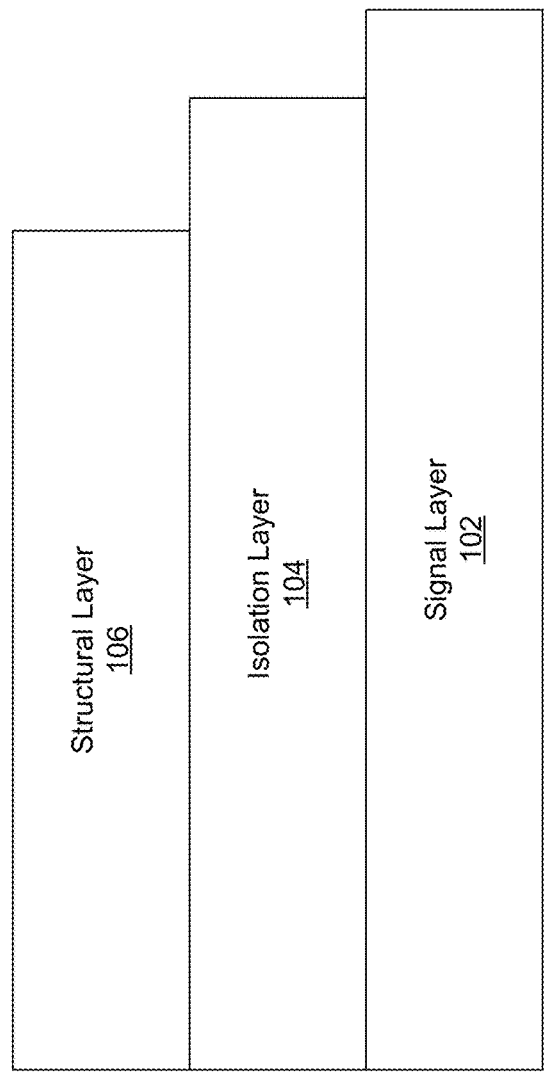

FIGS. 1A-1C are side, cross-sectional views of example implementations of layers 100 of a probe tip subassembly (e.g., a probe tip subassembly 200, described herein) that is configured to test one or more optical components (e.g., one or more components, such as integrated circuits, of an array of optical devices, such as laser devices) that are included on a die (e.g., a die of a wafer, a singulated die, or a singulated die on a substrate, among other examples) or that are cut from a die or a wafer. As shown in FIGS. 1A-1C, the layers 100 may include a signal layer 102, an isolation layer 104, and/or a structural/shielding layer 106. The signal layer 102 may include a conductive material, such as a material that includes copper (Cu), a beryllium copper (BeCu) alloy, tungsten (W), Paliney, Neyoro, and/or another conductive material. In some implementations, the isolation layer 104 may include a dielectric material, such as material that includes polyimide and/or another insulative material. The structural/shielding layer 106 may include a conductive material, such as a material that includes, Cu, a BeCu alloy, W, Paliney, Neyoro and/or another conductive material.

The signal layer 102 may be configured to transmit an electric signal (e.g., an electric pulse signal, an electric sine wave signal, and/or an electric direct current (DC) signal, among other examples). For example, the signal layer 102 may be configured as a probe tip (e.g., a probe tip 202, described herein) to transmit an electric signal to test the one or more optical components. As further described herein, the signal layer 102 may receive the electric signal from at least one high speed switch (e.g., at least one high speed switch 304, described herein). The isolation layer 104 may be configured to electrically and/or physically insulate the signal layer 102 (e.g., from the structural/shielding layer 106 and/or one or more other components of the probe tip subassembly). The structural/shielding layer 106 may be configured to provide electrical shielding for the signal layer 102 and/or the probe tip subassembly and/or to provide electrical grounding for the signal layer 102 and/or the probe tip subassembly. Additionally, or alternatively, the structural/shielding layer 106 may be configured to provide mechanical strength for the signal layer 102 and/or the probe tip subassembly and/or to provide a spring force for the signal layer 102 and/or the probe tip subassembly.

As shown in FIGS. 1A-1C, the signal layer 102 may be disposed on a first surface of the isolation layer 104 (e.g., a top surface of the isolation layer 104, as shown in FIGS. 1A-1C) and/or the structural/shielding layer 106 may be disposed on a second surface of the isolation layer 104 (e.g., a bottom surface of the isolation layer 104, as shown in FIGS. 1A-1C). The signal layer 102 may be attached to the first layer of the isolation layer 104. For example, the signal layer 102 may be physically attached to the first surface of the isolation layer 104 via one or more adhesive layers (e.g., one or more layers that are configured to attach the signal layer 102 to the isolation layer 104) and/or via a connecting material (e.g., a material comprising solder, glue, and/or epoxy). As another example, the signal layer 102 may be coated, deposited, plated, or otherwise formed on the first surface of the isolation layer 104 (or vice versa). The structural/shielding layer 106 may be attached to the second surface of the isolation layer 104. For example, the structural/shielding layer 106 may be attached to the second surface of the isolation layer 104 via one or more adhesive layers (e.g., one or more layers that are configured to attach the structural/shielding layer 106 to the isolation layer 104) and/or via a connecting material. As another example, the structural/shielding layer 106 may be coated, deposited, plated, or otherwise formed on the second surface of the isolation layer 104 (or vice versa).

As shown in FIG. 1A, the signal layer 102 may be disposed coextensively on the first surface of the isolation layer 104 (e.g., such that the signal layer 102 is disposed on an entirety of the first surface of the isolation layer 104) and/or the structural/shielding layer 106 may be disposed coextensively on the second surface of the isolation layer 104 (e.g., such that the structural/shielding layer 106 is disposed on an entirety of the second surface of the isolation layer 104). However, other implementations are contemplated. For example, as shown in FIG. 1B, a left side of the signal layer 102 may be aligned with a left side of the isolation layer 104 and a right side of the signal layer 102 may extend farther than a right side of the isolation layer 104. In this way, a first portion of the signal layer 102 may be disposed on an entirety of the first surface of the isolation layer 104 and a second portion of the signal layer 102 may not be disposed on the isolation layer 104 (e.g., the second portion of the signal layer 102 extends beyond an end of the isolation layer 104).

As further shown in FIG. 1B, a left side of the structural/shielding layer 106 may be aligned with a left side of the isolation layer 104, and a right side of the isolation layer 104 may extend farther than right side of the structural/shielding layer 106. In this way, the structural/shielding layer 106 may be disposed on a first portion of the second surface of the isolation layer 104, and a second portion of the second surface of the isolation layer 104 may not be covered by the structural/shielding layer 106.

As another example, as shown in FIG. 1C, the structural/shielding layer 106 may be disposed on the first surface of the isolation layer 104, and/or the signal layer 102 may be disposed on the second surface of the isolation layer 104. As further shown in FIG. 1C, a left side of the structural/shielding layer 106 may be aligned with a left side of the isolation layer 104, and a right side of the isolation layer 104 may extend farther than right side of the structural/shielding layer 106. In this way, the structural/shielding layer 106 may be disposed on a first portion of the first surface of the isolation layer 104, and a second portion of the first surface of the isolation layer 104 may not be covered by the structural/shielding layer 106. As further shown in FIG. 1C, a left side of the signal layer 102 may be aligned with a left side of the isolation layer 104, and a right side of the signal layer 102 may extend farther than right side of the isolation layer 104. In this way, a first portion of the signal layer 102 may be disposed on an entirety of the second surface of the isolation layer 104, and a second portion of the signal layer 102 may not be disposed on the isolation layer 104 (e.g., the second portion of the signal layer 102 extends beyond an end of the isolation layer 104).

In some implementations, the signal layer 102 and/or the structural/shielding layer 106 may be configured to provide rigidity and/or hardness to the probe tip subassembly. For example, when the signal layer 102 and/or the structural/shielding layer 106 comprises a BeCu alloy (e.g., a C17200 BeCu alloy), the signal layer 102 and/or the structural/shielding layer 106 may have a rigidity and/or hardness comparable to steel. Accordingly, the probe tip subassembly is therefore less prone to breakage and/or more likely to have a longer operable life than that of a conventional probe tip, such as a MEMS probe tip.

In some implementations, the isolation layer 104 may be configured to provide flexibility to the probe tip subassembly. For example, the isolation layer 104 may include a flexible material comprising polyimide. In combination with the rigidity and/or hardness provided by the signal layer 102, this creates a spring force associated with the probe tip subassembly. For example, the probe tip subassembly may bend and/or flex when the signal layer 102 (e.g., when configured as a probe tip) contacts the one or more optical components. In this way, the probe tip subassembly reduces a likelihood of damage to the one or more optical components (e.g., as compared to a non-flexible probe tip). In some implementations, when the structural/shielding layer 106 is present in the probe tip subassembly, the rigidity and/or hardness provided by the structural/shielding layer 106 may increase the spring force associated with the probe tip subassembly.

As indicated above, FIGS. 1A-1C are provided merely as an example. Other examples may differ from what is described with regard to FIGS. 1A-1C.

Figure 2B:
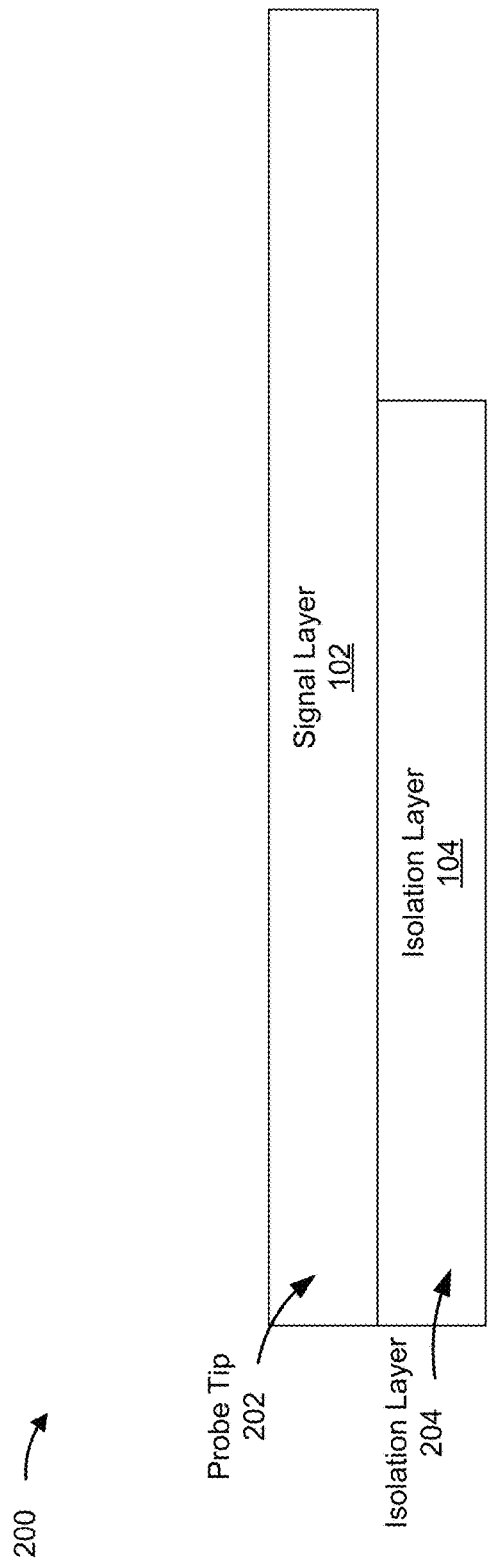
Figure 2C:
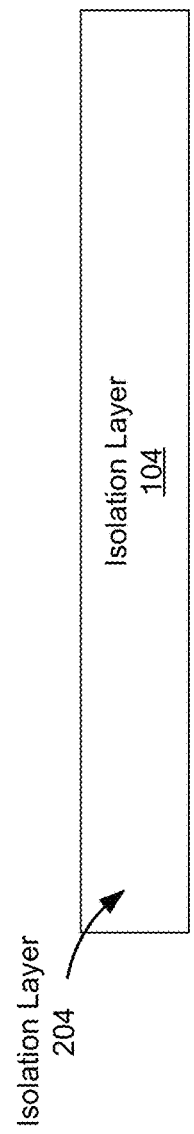

FIGS. 2A-2C are various views of an example implementation of a probe tip subassembly 200. FIG. 2A is a top-down view of the probe tip subassembly 200. FIG. 2B is a cross-sectional view of the probe tip subassembly 200 along line A-A of FIG. 2A. FIG. 2C is a cross-sectional view of the probe tip subassembly 200 along line B-B of FIG. 2A. As shown in FIG. 2A, the probe tip subassembly 200 may include a plurality of probe tips 202, an isolation layer 204, and/or one or more alignment features 210. As further shown in FIG. 2A, the plurality of probe tips 202 may be cantilevered probe tips 202 (e.g., such that respective ends of the probe tips 202 extend beyond an end of the isolation layer 204). A width 206 (e.g., a lateral width) of a probe tip 202 may satisfy (e.g., may be less than) a probe tip width threshold, such as a probe tip width threshold within a range of 10 to 1000 micrometers (e.g., greater than or equal to 10 micrometers and less than or equal to 1000 micrometers). Additionally, or alternatively, adjacent probe tips 202 may be separated by a distance 208 (e.g., a lateral distance). The distance 208 may satisfy (e.g., may be less than) a distance threshold, such as a distance threshold within a range of 5 to 1000 micrometers (e.g., greater than or equal to 5 micrometers and less than or equal to 1000 micrometers).

In some implementations, the isolation layer 204 may comprise an isolation layer 104 and each probe tip 202 may comprise a signal layer 102. For example, as shown in FIG. 2B, a probe tip 202 that comprises a signal layer 102 may be disposed on an isolation layer 204 that comprises an isolation layer 104. Additionally, or alternatively, on some portions of the isolation layer 204, as shown in FIG. 2C, no probe tip 202 may be disposed on the isolation layer 204 that comprises the isolation layer 104. In this way, one or more probe tips 202 (e.g., that comprise respective portions of a signal layer 102) may be disposed on one or more respective portions of a surface (e.g., a top surface) of the isolation layer 204 (e.g., that comprises the isolation layer 104). Accordingly, a first portion of a probe tip 202 (e.g., that comprises a signal layer 102) may be disposed on a corresponding portion of a surface of the isolation layer 204 (e.g., that comprises an isolation layer 104), and a second portion of the probe tip 202 may extend past an end of the surface of the isolation layer 204 (e.g., to form a cantilevered probe tip 202). Additional implementations related to the probe tips 202 and the isolation layer 204 include different configurations of the signal layer 102, the isolation layer 104, and/or the structural/shielding layer 106 of the layers 100 as described herein in relation to FIGS. 1A-1C. For example, a probe tip 202 (e.g., that comprises a signal layer 102) may be disposed coextensively on a corresponding portion of a surface of the isolation layer 204 (e.g., that comprises an isolation layer 104), such that the probe tip 202 is disposed on an entirety of the corresponding portion of the surface of the isolation layer 204 (e.g., in a similar manner as that described herein in relation to FIG. 1A).

As further shown in FIG. 2A, the one or more alignment features 210 may be configured to align the isolation layer 204 and/or the probe tip subassembly 200 to another component and/or to align components and/or features of the probe tip subassembly 200. For example, an alignment feature 210 may be configured to engage with an alignment feature of a driver PCBA (e.g., driver PCBA 302, described herein). The alignment feature 210 may be a protrusion (e.g., a dowel or other protrusion), and the alignment feature of the driver PCBA may be an opening (e.g., a recess or aperture). The alignment feature 210 and the alignment feature of the driver PCBA therefore may be configured to engage with each other (e.g., the alignment feature 210 may insert into the alignment feature of the driver PCBA). In this way, the alignment feature 210 and/or the alignment feature of the driver PCBA may be configured to align and/or maintain a position of the probe tip subassembly 200 in relation to the driver PCBA (e.g., to maintain alignment of a via 306 of the driver PCBA 302, described herein, and a probe tip 202 of the probe tip subassembly 200). As another example, a structural/shielding layer 106 may be configured to be disposed on another surface of the isolation layer 204 (e.g., a bottom surface of the isolation layer 204), and the alignment feature 210 may be configured to align the structural/shielding layer 106 on the other surface of the isolation layer 204.

As indicated above, FIGS. 2A-2C are provided merely as an example. Other examples may differ from what is described with regard to FIGS. 2A-2C. For example, the probe tip subassembly 200 may include a structural/shielding layer 106 in addition to the signal layer 102 and the isolation layer 104 (e.g., as shown in FIG. 1A-C).

Figure 3A:
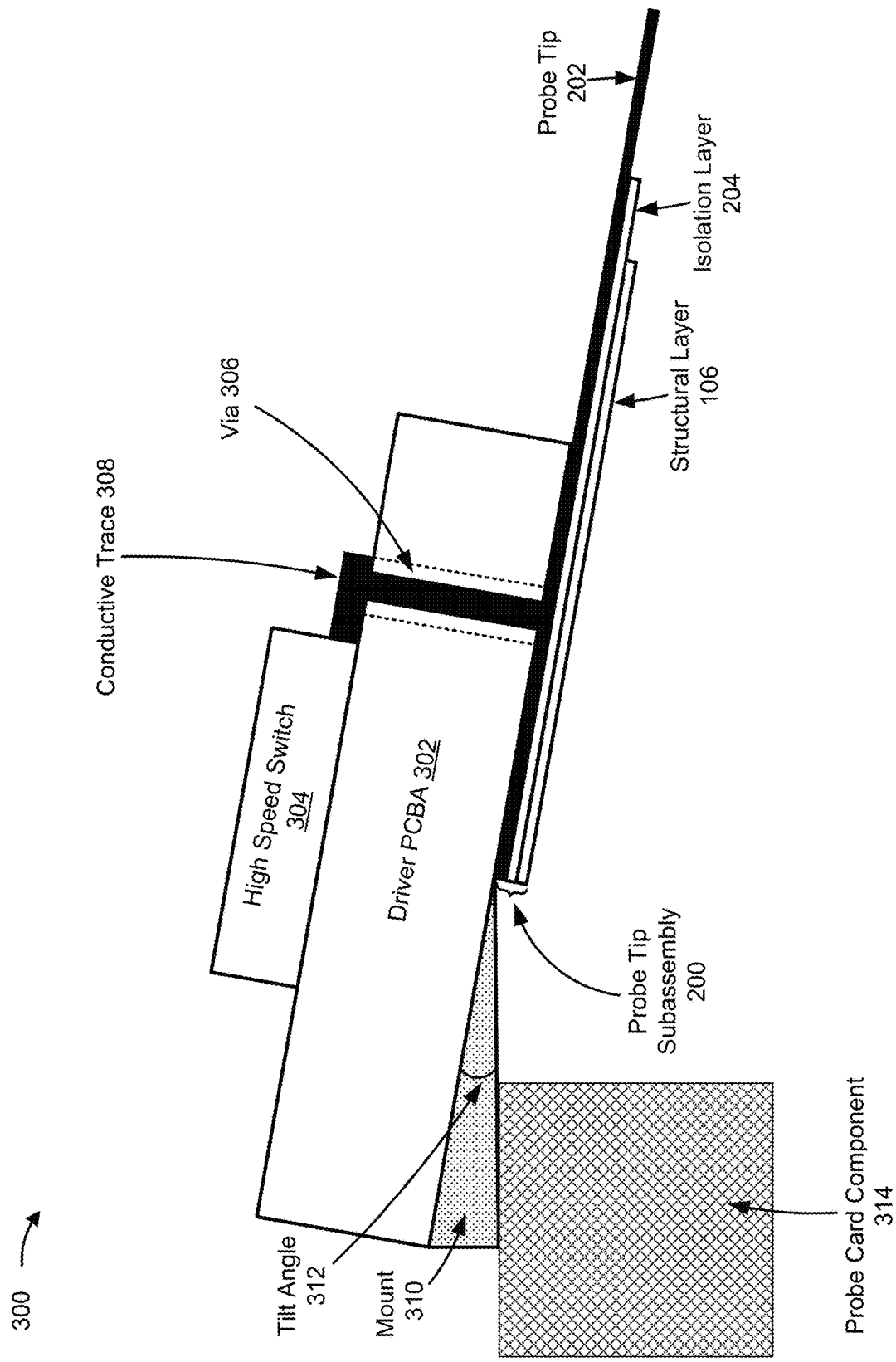
FIGS. 3A-3C are side, cross-sectional views of example implementations of a probe tip assembly described herein.
Figure 3B:
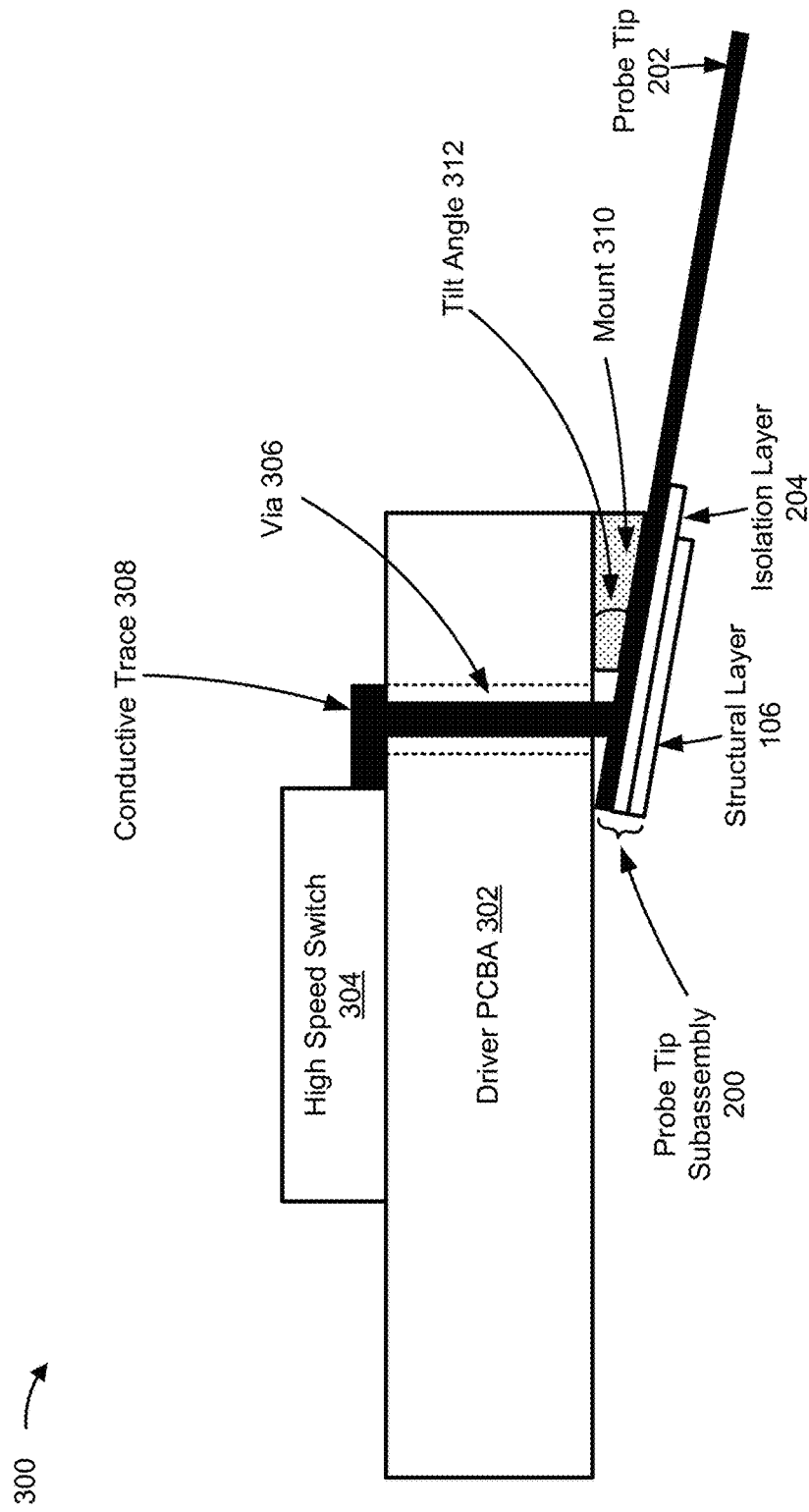

FIGS. 3A-3B are side, cross-sectional views of example implementations of a probe tip assembly 300.

As shown in FIGS. 3A-3B, the probe tip assembly 300 may include a driver printed circuit board assembly (PCBA) 302, at least one high speed switch 304 (e.g., that includes at least one of an integrated circuit (IC), a capacitor, a resistor, or a field-effect transistor (FET), among other examples) one or more vias 306, one or more conductive traces 308, a mount 310, and/or a probe tip subassembly 200. The probe tip assembly includes a probe tip 202 and may further include an isolation layer 204 (e.g., that comprises an isolation layer 104) and/or a structural/shielding layer 106. As shown in FIGS. 3A-3B, the probe tip 202 may be a cantilevered probe tip, such that an end of the probe tip 202 extends beyond an end of the driver PCBA 302. As further shown in FIG. 3A-3B, respective ends of the isolation layer 204 and/or the structural/shielding layer 106 may extend beyond the end of the driver PCBA 302 by a same or lesser amount as that of the probe tip 202.

In some implementations, the at least one high speed switch 304 may be configured to generate an electric signal (e.g., an electric pulse signal, an electric sine wave signal, and/or an electric direct current (DC) signal, among other examples). For example, the at least one high speed switch 304 may be configured to generate an electric signal to test one or more optical components (e.g., one or more integrated circuits of an optical device) that are included on a die (e.g., a die of a wafer, a singulated die, or a singulated die on a substrate, among other examples) or that are cut from a die or a wafer.

The driver PCBA 302 may comprise a rigid PCB, a flex PCB, or a rigid-flex PCB. For example, when the driver PCBA 302 includes a flex PCB, the PCBA 302 may include alternating layers of the signal layer 102, the insulation layer 104, and/or the structural/shielding layer 106. As another example, the PCBA may comprise a flex PCB attached to a rigid PCB or a flex PCB attached to a rigid material (e.g., a metal, a ceramic, and/or other rigid material), among other examples.

In some implementations, the driver PCBA 302 may include one or more material layers that are configured to mechanically support and/or electrically connect components of the probe tip assembly 300. For example, the driver PCBA 302 may mechanically support the at least one high speed switch 304 (e.g., the at least one high speed switch 304 may be mechanically attached to a first surface of the driver PCBA 302, such as a top surface of the driver PCBA 302) and/or the probe tip subassembly 200 (e.g., the probe tip subassembly 200 may be mechanically attached to a second surface of the driver PCBA 302, such as a bottom surface of the driver PCBA 302).

In some implementations, the driver PCBA 302 may electrically connect the at least one high speed switch 304 and the probe tip subassembly 200. For example, the driver PCBA 302 may include a via 306, of the one or more vias 306, that includes a conductive trace 308, of the one or more conductive traces 308 (e.g., each via 306 may include a corresponding conductive trace 308). The via 306 may comprise a hole in the driver PCBA 302 that includes some or all of the conductive trace 308 within the via 306. The via 306 and conductive trace 308 may comprise a conductive material, such as Cu, nickel (Ni) and/or gold (Au), among other examples. The conductive trace 308 of the via 306 may electrically connect the at least one high speed switch 304 to the probe tip 202 of the probe tip subassembly 200.

In this way, the driver PCBA 302, the at least one high speed switch 304, the via 306, and/or the conductive trace 308 may provide an electrical path from the at least one high speed switch 304 to the probe tip 202 of the probe tip subassembly 200. In some implementations, an inductance value associated with the electrical path may satisfy (e.g., may be less than) an inductance threshold. In this way, the at least one high speed switch 304 is electrically connected to the probe tip subassembly 200 via a low inductance electrical connection, which facilitates the at least one high speed switch 304 and/or the probe tip assembly 300 being able to generate and/or utilize nanosecond electric signals with high current, high power, and/or the like to test the one or more optical components.

In some implementations, as shown in FIGS. 3A-3B, the driver PCBA 302 may be mechanically attached to the mount 310. The mount 310 may have a wedge shape, or other type of structure, associated with a tilt angle 312. The tilt angle 312 may be within a particular tilt angle range, such as between approximately 8 and 12 degrees. This may cause the probe tip subassembly 200 to be tilted at an angle (e.g., that is the same as or similar to tilt angle 312).

In an example, the probe tip assembly 300 may be included in a probe card (e.g., a probe card 400, described herein), and the mount 310, as shown in FIG. 3A, may be disposed on and/or mechanically attached to a surface (e.g., a top surface) of a probe card component 314, of the probe card, that is configured to hold and/or physically support the probe tip assembly 300. Accordingly, the mount 310 may cause the driver PCBA 302 to be tilted an angle, which may cause the probe tip subassembly 200 to be tilted at an angle. For example, the mount 310 may cause a surface (e.g., a top surface) of the probe tip subassembly 200 to be tilted at an angle (e.g., that is the same as, within a tolerance, the tilt angle 312) in relation to a surface (e.g., a top surface) of the probe card component 314.

In another example, as shown in FIG. 3B, the mount 310 may be disposed between the driver PCBA 302 and the probe tip subassembly 200. For example, a first surface of the mount 310 (e.g., a top surface of the mount 310) may be disposed on a surface (e.g., a bottom surface) of the driver PCBA 302, and a second surface (e.g., a bottom surface) of the mount 310 may be disposed on a surface (e.g., a top surface) of the probe tip subassembly 200. The mount 310 may therefore cause the probe tip subassembly 200 to be tilted at an angle. For example, the mount 310 may cause a surface (e.g., a top surface) of the probe tip subassembly 200 to be tilted at an angle (e.g., that is the same as, within a threshold, the tilt angle 312) in relation to a surface (e.g., a bottom surface) of the driver PCBA 302.

In this way, the mount 310 allows the probe tip subassembly 200 to be disposed over the one or more optical components that are to be tested (e.g., at an angle that is the same, within a tolerance, the tilt angle 312). Accordingly, the probe tip 202 of the probe tip subassembly 200 can contact the one or more optical components to provide an electric signal that is generated by the at least one high speed switch 304 and transmitted to the probe tip 202 (e.g., through a via 306 and/or a conductive trace 308).

While some implementations of the probe tip assembly 300 described herein in relation to FIGS. 3A-3B include particular configurations of the driver PCBA 302, the at least one high speed switch 304, the one or more vias 306, the one or more conductive traces 308, the mount 310, and/or the probe tip subassembly 200, other implementations are contemplated. For example, the at least one high speed switch 304 may be disposed in a recess of the driver PCBA 302 (e.g., a recess within a bottom surface of the driver PCBA 302), and the at least one high speed switch 304 may be disposed on a surface of the probe tip subassembly 200 (e.g., a top surface of the probe tip subassembly 200), such that the at least one high speed switch 304 is physically within the recess of the driver PCBA 302 and electrically connected to the probe tip subassembly 200 (e.g., the probe tip 202 of the probe tip subassembly 200).

Figure 3C:
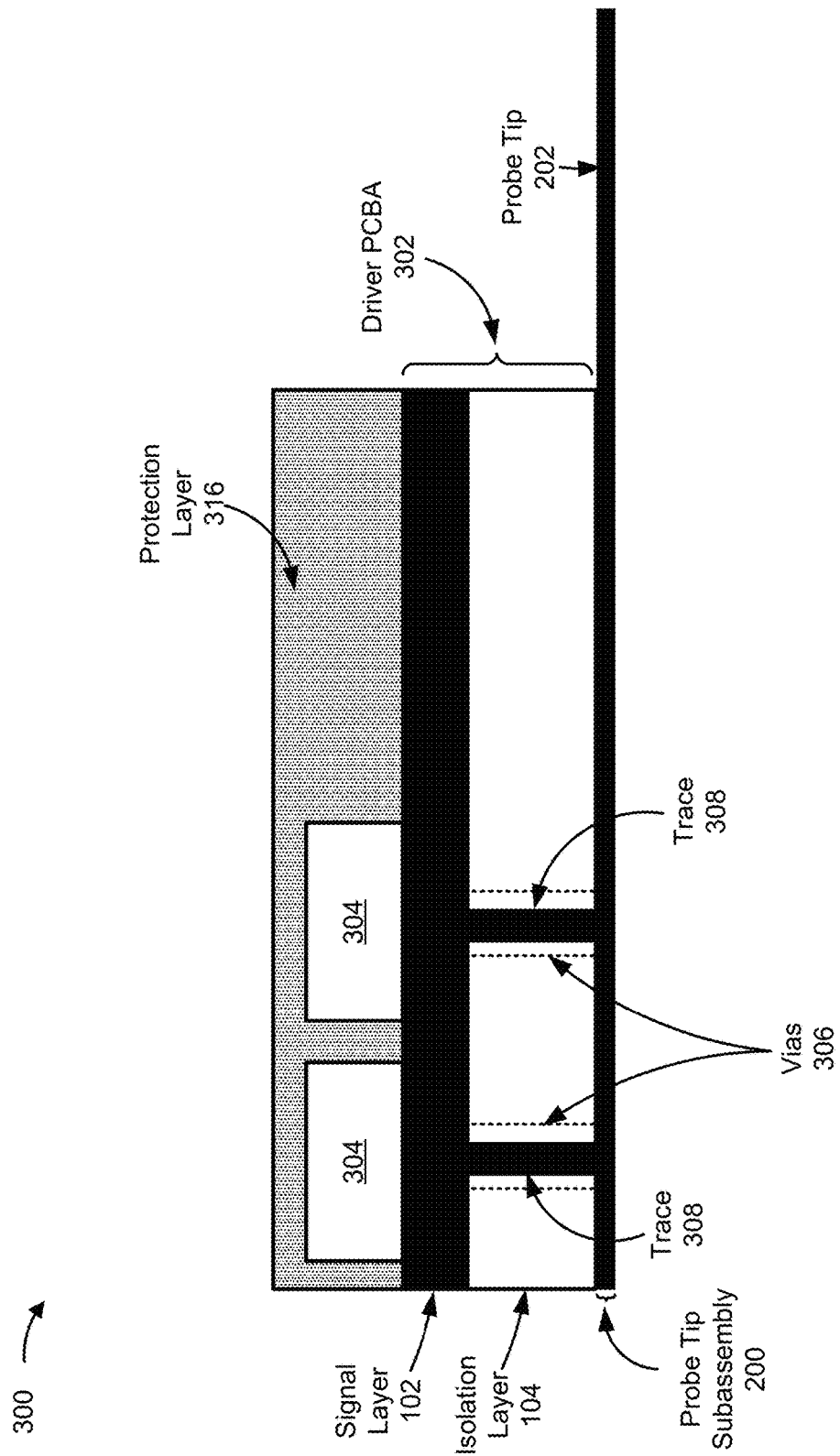

As shown in FIG. 3C, the probe tip assembly 300 may include the driver PCBA 302, the at least one high speed switch 304 (shown as two separate high speed switches 304), and the probe tip subassembly 200. As further shown in FIG. 3C, the driver PCBA 302 may comprise a flex PCBA that includes, for example, a signal layer 102 disposed on an isolation layer 104. In some implementations, the driver PCBA may include multiple alternating layers of the signal layer 102, the isolation layer 104, and/or other additional layers. The probe tip subassembly 200 may include, for example, just the probe tip 202. As shown in FIG. 3C, the probe tip 202 may be a cantilevered probe tip, such that an end of the probe tip 202 extends beyond an end of the driver PCBA 302. In some implementations, the probe tip subassembly 200 may additionally include the isolation layer 104 and/or the structural/shielding layer 106 (e.g., as described herein). Respective ends of the isolation layer 204 and/or the structural/shielding layer 106 may extend beyond the end of the driver PCBA 302 by a same or lesser amount as that of the probe tip 202.

As further shown in FIG. 3C, the driver PCBA 302 may include the one or more vias 306 (e.g., shown as formed in the isolation layer 104) that include the one or more conductive traces 308 that connect the at least one high speed switch 304 (e.g., that is disposed on a top surface of the driver PCBA 302) to the probe tip 202 of the probe tip subassembly 200 (e.g., that is disposed on a bottom surface of the driver PCBA 302). As further shown in FIG. 3C, a protective layer 316 may be disposed on the driver PCBA 302 and/or the at least one high speed switch 304. The protective layer 316 may comprise the structural/shielding layer 106 and/or another rigid material (e.g., a metal, such as aluminum; a ceramic; and/or other rigid material), among other examples.

As indicated above, FIGS. 3A-3B are provided merely as an example. Other examples may differ from what is described with regard to FIGS. 3A-3B.

Figure 4:
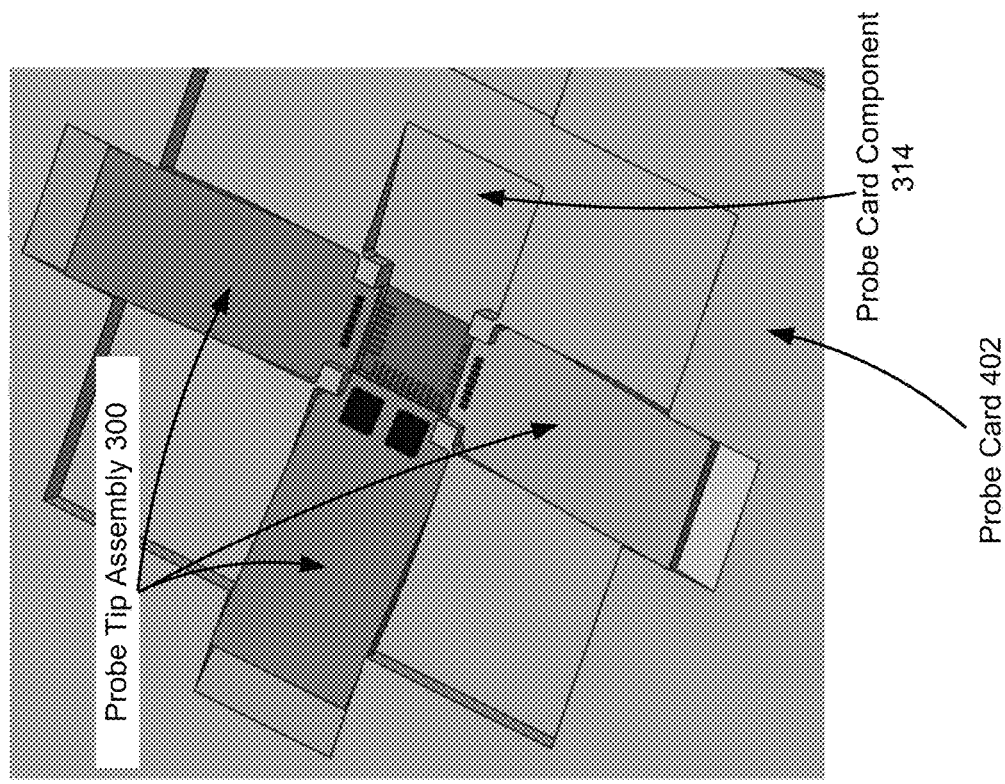
FIG. 4 illustrates an example associated with a probe tip assembly described herein.
Figure 4:
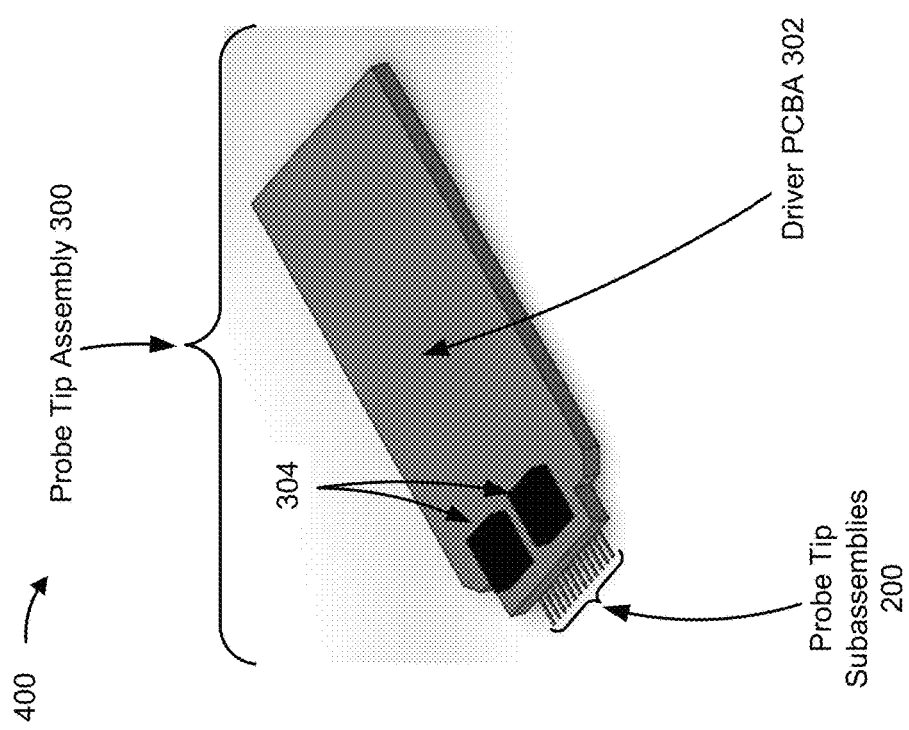

FIG. 4 illustrates an example 400 associated with a probe tip assembly (e.g., probe tip assembly 300). As shown in FIG. 4, a probe tip assembly 300 may include a plurality of probe tip subassemblies 200 (e.g., as described in relation to FIGS. 2A-2C, and 3A-3C) and a driver PCBA 302 (e.g., as described in relation to FIGS. 3A-3C) and at least one high speed switch 304. As further shown in FIG. 4, one or more probe tip assemblies 300 may be included in a probe card 402 (e.g., for testing one or more optical components). The probe card 402 may include, for each probe tip assembly 300, a component (e.g., a probe card component 314) that is configured to hold and/or physically support the probe tip assembly 300 and/or allow the probe tip assembly 300 to be tilted (e.g., at a tilt angle 312) to allow the probe tip subassemblies 200 of the probe tip assembly 300 to test the one or more optical components.

As indicated above, FIG. 4 is provided merely as an example. Other examples may differ from what is described with regard to FIG. 4.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A probe tip assembly, comprising:
a driver printed circuit board assembly (PCBA);
a probe tip subassembly comprising:
an isolation layer including a first end and a second end, and
a plurality of probe tips, wherein:
a probe tip, of the plurality of probe tips, includes a first end and a second end,
wherein the first end of the probe tip is aligned with the first end of the isolation layer,
wherein the isolation layer is on only one side of the probe tip, and
wherein the second end of the probe tip extends beyond the second end of the isolation layer; and
a structural layer disposed on only one side of the isolation layer opposite the probe tip,
the isolation layer being disposed between the probe tip and the structural layer;
at least one high speed switch; and
a conductive trace electrically connecting the at least one high speed switch and the probe tip through a via, the via extending from one end at a surface of the driver PCBA through the driver PCBA to another end at the probe tip, and
the PCBA and the probe tip are configured to transmit an electric signal to test an optical component.

2. The probe tip assembly of claim 1, wherein:
the probe tip subassembly is disposed on another surface of the driver PCBA.

3. The probe tip assembly of claim 1, wherein the at least one high speed switch is disposed on the surface of the driver PCBA, and
wherein the probe tip subassembly is disposed on another surface of the driver PCBA opposite the surface.

4. The probe tip assembly of claim 1, wherein:
the conductive trace is at least partially disposed on the surface of the driver PCBA.

5. The probe tip assembly of claim 1, wherein the probe tip includes a material comprising at least one of:
beryllium copper,
copper,
tungsten,
Paliney, or
Neyoro.

6. The probe tip assembly of claim 1, wherein the structural layer comprises conductive material that provides at least one of electrical shielding for the probe tip or electrical grounding for the probe tip.

7. The probe tip assembly of claim 1, further comprising a mount configured to cause the probe tip subassembly to have a tilt angle within a range of 8 to 12 degrees relative to a side of the PCBA.

8. The probe tip assembly of claim 1, wherein the probe tip assembly is configured to be included in a probe card,
wherein the probe tip assembly is configured to be disposed on a probe card component of the probe card.

9. The probe tip assembly of claim 1, wherein a connection point between the conductive trace and the probe tip is directly beneath the via.

10. The probe tip assembly of claim 1, wherein the other end of the via is proximate to the first end of the probe tip.

11. A probe tip subassembly, comprising:
an isolation layer including a first end and a second end;
a plurality of probe tips disposed on respective portions of a surface of the isolation layer wherein:
a probe tip, of the plurality of probe tips, includes a first end and a second end,
wherein the first end of the probe tip is aligned with the first end of the isolation layer,
wherein the isolation layer is on only one side of the probe tip, and
wherein the second end of the probe tip extends beyond the second end of the isolation layer;
a structural layer disposed on only one side of the isolation layer opposite the probe tip,
the isolation layer being disposed between the probe tip and the structural layer, and
the probe tip is configured to transmit an electric signal to test an optical component; and
a conductive trace electrically connecting the probe tip to an optical device through a via, the via extending from one end at a surface of a driver printed circuit board assembly (PCBA) through the driver PCBA to another end at the probe tip.

12. The probe tip subassembly of claim 11, wherein:
the isolation layer includes a dielectric material; and
the probe tip includes a material comprising at least one of:
beryllium copper,
copper,
tungsten,
Paliney, or
Neyoro.

13. The probe tip subassembly of claim 11, wherein the probe tip is attached to the isolation layer via at least one of:
one or more adhesive layers;
coating, deposition, or plating on the isolation layer; or
a connecting material.

14. The probe tip subassembly of claim 11, wherein:
the probe tip has a width that satisfies a probe tip width threshold,
wherein the probe tip width threshold is within a range of 10 to 1000 micrometers.

15. The probe tip subassembly of claim 11, wherein:
a distance between the probe tip and an adjacent probe tip, of the plurality of probe tips, satisfies a distance threshold,
wherein the distance threshold is within a range of 5 to 1000 micrometers.

16. The probe tip subassembly of claim 11, wherein the structural layer comprises conductive material that provides at least one of electrical shielding for the probe tip or electrical grounding for the probe tip.

17. The probe tip subassembly of claim 11, wherein the structural layer is configured to, at least one of:
provide electrical shielding for the probe tip;
provide electrical grounding for the probe tip;
provide mechanical strength for the probe tip; or
provide a spring force for the probe tip.

18. A probe tip subassembly, comprising:
an isolation layer including a first end and a second end;
a signal layer disposed on a surface of the isolation layer, wherein:
an end of the signal layer is aligned with the first end of the isolation layer,
the signal layer is on only one side of the isolation layer,
a portion of the signal layer extends beyond the second end of the isolation layer, and
the portion of the signal layer is configured to transmit an electric signal to test an optical component;

a structural layer disposed on only one side of the isolation layer opposite the signal layer,
the isolation layer being disposed between the structural layer and the signal layer; and
a conductive trace electrically connecting the signal layer to an optical device through a via, the via extending from one end at a surface of a driver printed circuit board assembly (PCBA) through the driver PCBA to another end at the signal layer.

19. The probe tip subassembly of claim 18, wherein:
the isolation layer includes a material comprising polyimide; and
the signal layer includes a material comprising at least one of:
beryllium copper,
copper,
tungsten,
Paliney, or
Neyoro.

20. The probe tip subassembly of claim 18, wherein:
the structural layer includes a material comprising at least one of:
beryllium copper,
copper,
tungsten,
Paliney, or
Neyoro.

* * * * *